US012598858B2

(12) United States Patent
Volz et al.

(10) Patent No.: US 12,598,858 B2
(45) Date of Patent: Apr. 7, 2026

(54) LIGHTING DEVICE FOR MOTOR VEHICLES HAVING AN EMITTER THAT EMITS LIGHT BY THERMALLY ACTIVATED DELAYED FLUORESCENCE

(71) Applicant: SAMSUNG DISPLAY CO., LTD., Yongin-si (KR)

(72) Inventors: Daniel Volz, Karlsruhe (DE); Harald Fluegge, Karlsruhe (DE)

(73) Assignee: Samsung Display Co., Ltd., Yongin-si (KR)

( * ) Notice: Subject to any disclaimer, the term of this patent is extended or adjusted under 35 U.S.C. 154(b) by 1241 days.

(21) Appl. No.: 16/756,254

(22) PCT Filed: Oct. 18, 2018

(86) PCT No.: PCT/EP2018/078578

§ 371 (c)(1),
(2) Date: Mar. 23, 2021

(87) PCT Pub. No.: WO2019/077051

PCT Pub. Date: Apr. 25, 2019

(65) Prior Publication Data

US 2021/0210709 A1 Jul. 8, 2021

(30) Foreign Application Priority Data

Oct. 19, 2017 (DE) ..................... 10 2017 218 708.5

(51) Int. Cl.
*H10K 50/11* (2023.01)
*F21S 43/14* (2018.01)
*H10K 101/10* (2023.01)

(52) U.S. Cl.
CPC .............. *H10K 50/11* (2023.02); *F21S 43/14* (2018.01); *H10K 2101/10* (2023.02)

(58) Field of Classification Search
CPC .. H10K 50/11; H10K 85/654; H10K 85/6572; H10K 2101/10; H10K 2101/20; C09K 11/02; C09K 11/06; C09K 2211/1007; C09K 2211/1018; F21S 43/14; F21S 41/155; F21S 43/145; F21Y 2115/10
See application file for complete search history.

(56) References Cited

U.S. PATENT DOCUMENTS

| | | | | |
|---|---|---|---|---|
| 9,908,457 | B2 | 3/2018 | Reinprecht et al. | |
| 9,917,270 | B1 * | 3/2018 | Volz | H10K 50/13 |
| 10,263,196 | B2 | 4/2019 | Danz et al. | |
| 10,804,481 | B2 * | 10/2020 | Haldi | C09K 11/06 |
| 10,937,982 | B2 * | 3/2021 | Haldi | H10K 85/6572 |
| 11,462,692 | B2 * | 10/2022 | Fluegge | H10K 85/654 |
| 11,508,916 | B2 * | 11/2022 | Liaptsis | H10K 50/121 |
| 2005/0036327 | A1 * | 2/2005 | Patel | B60Q 1/50 362/487 |
| 2006/0063027 | A1 * | 3/2006 | Vestweber | C07C 211/54 428/917 |
| 2009/0134784 | A1 * | 5/2009 | Lin | C09K 11/06 546/276.7 |
| 2014/0056020 | A1 * | 2/2014 | Bungenstock | F21S 43/145 362/459 |
| 2017/0062734 | A1 | 3/2017 | Suzuki et al. | |
| 2019/0214577 | A1 * | 7/2019 | Pan | C07D 487/04 |

FOREIGN PATENT DOCUMENTS

| | | | | |
|---|---|---|---|---|
| CN | 106749050 | A * | 5/2017 | C07D 221/18 |
| DE | 10217633 | A1 | 11/2003 | |
| DE | 102009028525 | A1 * | 5/2010 | F21S 48/1154 |
| DE | 102009009087 | A1 | 8/2010 | |
| DE | 102013217848 | A1 | 3/2015 | |
| DE | 102014111119 | A1 | 2/2016 | |
| DE | 102016108332 | B3 | 2/2017 | |
| EP | 2338735 | A1 * | 6/2011 | B60Q 11/005 |
| EP | 3113239 | A1 | 12/2015 | |
| EP | 3389107 | A1 | 12/2016 | |
| JP | 2016110075 | A * | 6/2016 | H02J 50/20 |
| JP | 2017188399 | A | 10/2017 | |
| WO | 2014/179824 | A1 | 11/2014 | |
| WO | WO-2017092495 | A1 * | 6/2017 | C07D 209/56 |
| WO | WO-2018113783 | A1 * | 6/2018 | C07C 11/54 |
| WO | 2017/099160 | A1 | 9/2018 | |
| WO | WO-2021131766 | A1 * | 7/2021 | C07D 209/86 |

OTHER PUBLICATIONS

English Translation of WO-2018113783-A1; Pan; Jun. 28, 2018 (Year: 2018).*
English Translation of WO-2017092495-A1; Huang H; - Jun. 8, 2017 (Year: 2017).*
CzSi; Osilla enabling science; https://www.ossila.com/products/czsi#:~:text=CzSi%2C%20TADF%20host%20material%20for%20blue%20electrophosphorescence&text=CzSi%20is%20known%20for%20its,morphological%20and%20superior%20electrochemical%20stability. (Year: 2025).*
EIC Search (See Printout) (Year: 2025).*
Naqvi, Bilal A. et al.; "What controls the orientation of TADF emitters?—Supplementary Material"; 2021; 17pp.
Kim et al., Adv. Mater., 2015, 27:2515-2520.
Pang et al., Journal of Solid State Lighting, 2014, 1:7.
Wong et al., Adv. Mater., 2017, 29:1605444 (54 pages).
Ren et al., Chem. Mater., 2004, 16:4743-4747.
Wang, Zhiming et al.; "Phenanthro[9,10-d]imidazole as a new building block for blue light emitting materials"; Journal of Materials Chemistry; vol. 21; Feb. 28, 2011; pp. 5451-5456.

(Continued)

*Primary Examiner* — Robert J May
(74) *Attorney, Agent, or Firm* — Womble Bond Dickinson (US) LLP

(57) ABSTRACT

The present invention relates to a lighting device for a motor vehicle, comprising at least one organic light-emitting diode (OLED) having an emission layer B, wherein the emission layer B comprises at least one emitter E that emits light by means of thermally activated delayed fluorescence (TADF). The present invention further relates to a method of generating light by means of such an OLED at an operating temperature above room temperature.

13 Claims, 1 Drawing Sheet

(56) References Cited

OTHER PUBLICATIONS

Wong, Michael Y. et al.; "Purely Organic Thermally Activated Delayed Fluorescence Materials for Organic Light-Emitting Diodes" Advanced Materials; vol. 29, Mar. 3, 2017; 1605444; 48pp, Jun. 21, 2024.
Office action dated Mar. 26, 2025, of corresponding European Patent Application No. 18796376.4, 5 pages.

* cited by examiner

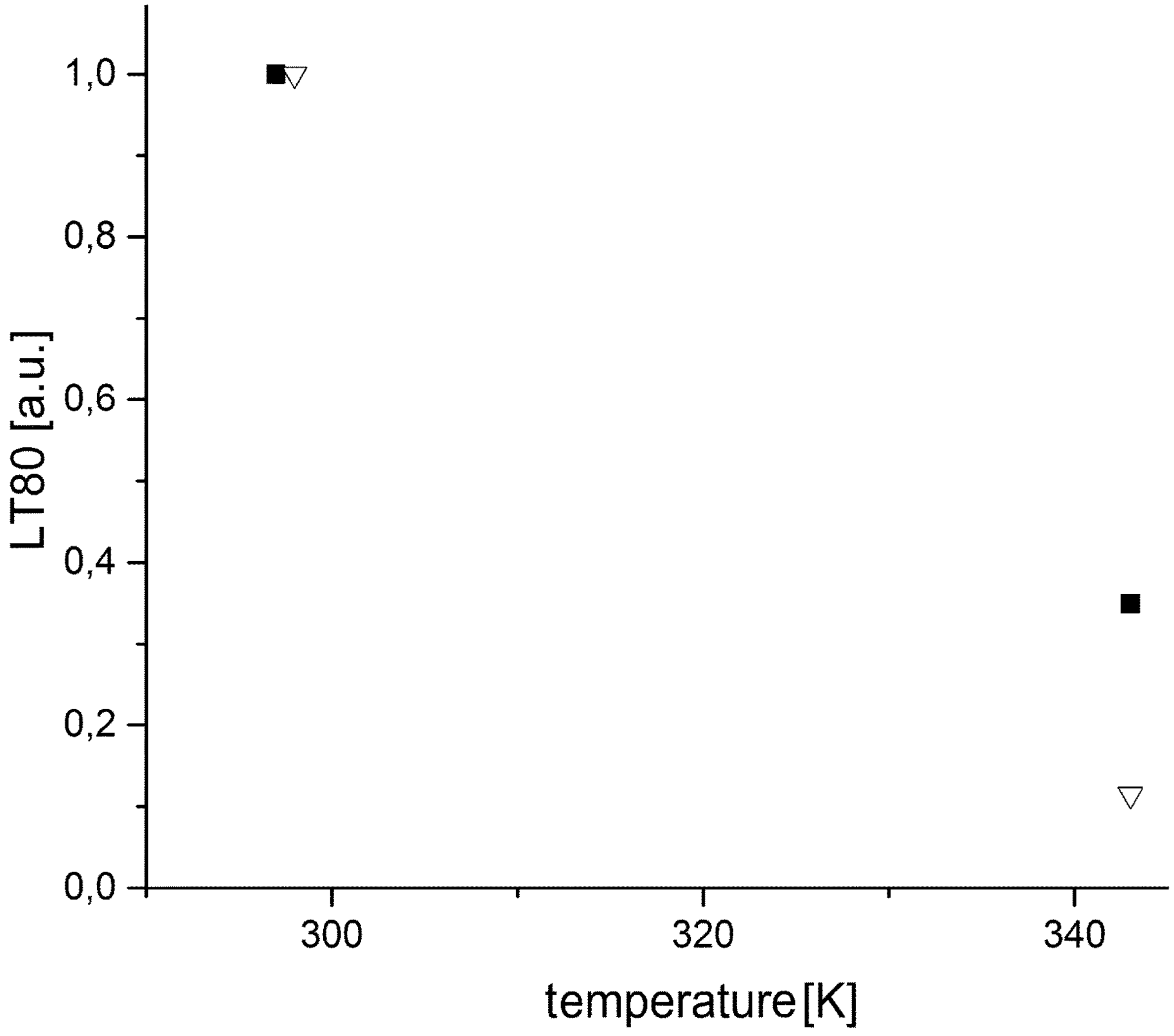
1,0
0,8
0,6
0,4
0,2
0,0
LT80 [a.u.]
300
320
340
temperature [K]

LIGHTING DEVICE FOR MOTOR VEHICLES HAVING AN EMITTER THAT EMITS LIGHT BY THERMALLY ACTIVATED DELAYED FLUORESCENCE

The present invention relates to a lighting device for a motor vehicle, comprising at least one organic light-emitting diode (OLED) having an emission layer B, wherein the emission layer B comprises at least one emitter E that emits light by means of thermally activated delayed fluorescence (TADF). The present invention further relates to a method of generating light by means of such an OLED at an operating temperature above room temperature. The present invention also particularly relates to the use of TADF-OLEDs at high operating temperatures (for example in the range from 30° C. to 160° C., and therefore for high-temperature applications), especially for the motor vehicle sector, for instance as part of a lighting device, especially as part of exterior lighting device.

DESCRIPTION

It is a feature of lighting devices based on organic light-emitting diodes (OLEDs) that they enable new configuration forms owing to their thin, lightweight and flexible construction. For instance, OLED-based lighting devices in the motor vehicle sector may be used on, especially bonded to, the bodywork or, owing to the possible transparency of the OLED, the windowpanes of the motor vehicle. The OLED lighting device may likewise be integrated into the windowpane or applied to the windowpane from the inside. Likewise possible is application to an already existing lighting device. DE-A 10217633 describes various possible uses of OLED-based exterior lighting devices. DE-A 102009009087, DE-A 102013217848, DE-A 102014111119 and WO 2014/179824 likewise teach OLEDs-based lighting means in motor vehicles.

However, some of the OLEDs taught therein have suboptimal properties. For instance, it is known that such conventional OLEDs have increasingly poorer optical properties and reduced lifetimes at elevated temperatures.

For applications in the exterior lighting of motor vehicles, OLEDs even at high ambient temperatures must have the legally required luminance over a long period of operation. Even outside the range, as a result of external influences such as solar radiation, the lighting device can be subjected to temperatures well above the operating temperature. During operation, the component temperature is further increased by the intrinsic heating of the OLED. It is typically possible to reach, for instance, temperatures in the range from 30° C. to more than 100° C., sometimes up to 160° C. The OLEDs used in the motor vehicle sector in the art regularly do not meet these demands especially on thermal stability. Therefore, the use of OLEDs in motor vehicles has to date been subject to considerable difficulties.

There was therefore a need for OLEDs for the motor vehicle sector that have high efficiency and sufficient lifetime when used at elevated temperatures.

It has been found that, surprisingly, the use of OLEDs that make use of the principle of thermally activated delayed fluorescence (TADF) is particularly advantageous in lighting devices in the motor vehicle sector. More particularly, it was possible to considerably improve the thermal stability and lifetime of the OLEDs under conditions as customary in the motor vehicle sector. The external quantum efficiency (EQE) of such a TADF-based OLED can even rise with rising temperature.

A first aspect of the invention therefore relates to a lighting device for a motor vehicle, comprising at least one organic light-emitting diode (OLED) having an emission layer B, wherein the emission layer B comprises at least one emitter E that emits light by means of thermally activated delayed fluorescence (TADF).

In other words, the invention relates to a lighting device that has been disposed (or is disposed) on or in the motor vehicle, comprising at least one organic light-emitting diode (OLED) having an emission layer B, wherein the emission layer B comprises at least one emitter E that emits light by means of thermally activated delayed fluorescence (TADF).

Typically, an OLED has the following construction:

a substrate, an anode, at least one emission layer B (light-emitting layer), and a cathode, wherein the anode or the cathode have been applied to the substrate, and the at least one emission layer is disposed between anode and cathode.

Typically, one or more hole injection and/or hole transport and/or electron blocker layers are present between anode and light-emitting layer B, and one or more electron injection and/or electron transport and/or hole blocker layers between cathode and light-emitting layer B. The individual layers are deposited sequentially.

The emission layer B is a central constituent of the OLED. If a voltage is applied to the OLED component, holes and electrons are injected by anode and cathode. Recombination of the holes and electrons in the emission layer generates excitons. Relaxation from excited states (for example from singlet states such as S1 and/or triplet states such as T1) to the ground state S0 should be via emission of light.

According to the invention, the emission layer B comprises a thermally activated delayed fluorescence (TADF) emitter E. TADF emitters have a first excited triplet state T1 below the first excited singlet state S1 at a sufficiently close energy level that up to 100% of the excitons formed in the recombination of holes and electrons can be utilized for the emission of light. This enables thermal repopulation of the S1 state from the T1 state.

In a preferred embodiment, the emitter E has an energy differential ΔE between the lowermost excited singlet state S1 and the triplet state T1 beneath (E(S1−T1) value) of not more than 0.3 eV.

In an even more preferred embodiment, the emitter E has an E(S1−T1) value of not more than 0.2 eV, especially of not more than 0.1 eV.

Owing to the thermal repopulation of the S1 state, in TADF emitters, the intensity of light emission (and therefore the quantum yield as well) and the emission lifetime typically depend on temperature. By contrast with fluorescence and phosphorescence emitters in which the quantum efficiency, especially the photoluminescence quantum yield (PLQY), and the exciton lifetime tau are not a function of temperature, the exciton lifetime in the case of TADF emitters continues to drop between room temperature (therefore about 20° C.) and 70° C., while quantum efficiency rises (and/or at least does not decrease/decreases less than expected).

In a preferred embodiment, therefore, the external quantum efficiency (EQE) of the OLED rises with rising temperature.

In a preferred embodiment, therefore, the external quantum efficiency (EQE) of the OLED does not decrease with rising temperature or decreases less than expected.

The terms "TADF material" and "TADF emitter" used in the application should be regarded as synonyms that are mutually interchangeable.

The emitter E may in principle have any chemical structure. It may, by way of example, be purely organic, may be a metal complex or may contain other inorganic constituents.

In a preferred embodiment, the emitter E is a purely organic TADF emitter.

Therefore, the emitter E preferably does not include any metal ions. Pure, organic TADF emitters E are known to those skilled in the art. Illustrative emitters for the colors of blue, green and red are described by Wong and Zysman-Colman ("Purely Organic Thermally Activated Delayed Fluorescence Materials for Organic Light-Emitting Diodes.", Adv Mater. 2017 June; 29 (22)) and EP-A 3113239.

The emitter E may be of any molecular size. It may be a large or small molecule. In a preferred embodiment, the emitter E has a molecular mass of more than 1000 g/mol. In another preferred embodiment, the emitter E has a molecular mass of not more than 1000 g/mol. By way of example, the emitter E may have a molecular mass in the range from 200 to 10000 g/mol, 300 to 5000 g/mol, 400 to 2000 g/mol, 250 to 1000 g/mol, 500 to 1000 g/mol, more than 1500 g/mol or more than 2000 g/mol.

In a preferred embodiment, the emitter E has an emission maximum in the range from 420 nm to 800 nm. In a preferred embodiment, the emitter E has an emission maximum in the range from 420 nm to 600 nm.

In a strongly preferred embodiment, the purely organic emitter E has an energy differential ΔE between the lowermost excited singlet state S1 and the triplet state T1 beneath of not more than 0.3 eV, and an emission maximum in the range from 420 nm to 800 nm (by way of example from 420 nm to 600 nm).

The inventive emitter E preferably has emissions in the visible region of the spectrum. More preferably, the emitter E has an emission maximum in the blue, sky blue, green, yellow or red spectral region.

The OLED of the invention also preferably has emissions in the visible region of the spectrum. More preferably, the OLED has an emission maximum in the blue, sky blue or green spectral region. In a preferred embodiment, the OLED therefore has an emission maximum in the range from 420 nm to 800 nm, by way of example from 420 nm to 600 nm. In a more preferred embodiment, the OLED therefore has an emission maximum in the range from 420 nm to 800 nm (by way of example from 420 nm to 600 nm) and the external quantum efficiency (EQE) of the OLED rises (and/or at least does not decrease/decreases less than expected) with rising temperature.

The photoluminescence quantum yield (PLQY) of the inventive emitter E is preferably 20% or more. The use of the emitter E in an optoelectronic device, for example of an OLED, may lead to higher efficiencies of the device.

Corresponding OLEDs typically have a higher stability than OLEDs with known emitter materials and a comparable color.

The blue spectral region is understood here to mean the visible region of less than 470 nm, preferably of 420 to 470 nm. The sky blue spectral region is understood here to mean the range from 470 nm to 499 nm. The green spectral region is understood here to mean the range from 500 nm to 569 nm. The yellow spectral region is understood here to mean the range from 570 nm to 639 nm, and the red spectral region the range from 640 nm to 800 nm. The emission maximum is within the respective range. By way of example, the OLED may therefore have an emission maximum in the range from 420 nm to 470 nm, in the range from 470 nm to 499 nm, in the range from 500 nm to 569 nm, in the range from 570 nm to 639 nm or in the range from 640 nm to 800 nm.

A preferred embodiment of the invention relates to an emitter E having a $\Delta E(S_1-T_1)$ value between the lowermost excited singlet state ($S_1$) and the triplet state ($T_1$) beneath of not higher than 5000 $cm^{-1}$, especially not higher than 3000 $cm^{-1}$, or not higher than 1500 $cm^{-1}$ or 1000 $cm^{-1}$, and/or an emission lifetime of not more than 150 μs, especially of not more than 100 μs, of not more than 50 μs, or of not more than 10 μs, and/or a main emission band having a half-height width of less than 0.55 eV, especially less than 0.50 eV, less than 0.48 eV, or less than 0.45 eV.

The lighting device for a motor vehicle may be any lighting device which is usable or will be used in or on a motor vehicle. This may be mounted or may have been mounted on the interior or the exterior of the motor vehicle or installed in other elements of the motor vehicle.

In a preferred embodiment, the lighting device is a signal light on the exterior of the motor vehicle. In a further-preferred embodiment, the lighting device is a signal light on the exterior of the motor vehicle which is selected from the group consisting of an alternately illuminated direction indicator, a taillight, a brakelight, a signal light to indicate autonomous or manual operation, an optionally elevated brakelight and an exterior display.

The emitter E may have any glass transition temperature (any glass transition point). In a preferred embodiment, the emitter E has a glass transition temperature exceeding 130° C.

More preferably, the emitter E has a glass transition temperature exceeding 140° C., especially exceeding 150° C.

The emission layer B may also have any glass transition temperature. The emission layer B preferably has a glass transition temperature exceeding 120° C., more preferably exceeding 130° C., even more preferably exceeding 140° C., especially exceeding 150° C.

In a preferred embodiment, the emission layer B comprises exclusively materials having a glass transition temperature exceeding 120° C.

More preferably, the emission layer B comprises exclusively materials having a glass transition temperature exceeding 130° C., more preferably exceeding 140° C., especially exceeding 150° C.

Preferably, the entire OLED also retains its mechanical stability at relatively high temperatures. In a preferred embodiment, therefore, the lighting device of the invention is a thermally stable lighting device and the OLED comprises exclusively materials having a glass transition temperature exceeding 120° C.

The OLED preferably comprises exclusively materials having a glass transition temperature exceeding 130° C., more preferably exceeding 140° C., especially exceeding 150° C. In a preferred embodiment, the lighting device is disposed on or in the motor vehicle such that, in prolonged operation of the motor vehicle at an outside temperature of 20° C., it is subject to an operating temperature elevated by at least 10° C. compared to the outside temperature. In a more preferred embodiment, the lighting device is disposed on or in the motor vehicle such that, in prolonged operation of the motor vehicle at an outside temperature of 20° C., it is subject to an operating temperature elevated by at least 25° C. compared to the outside temperature.

As used herein, "prolonged operation" means a period of operation in which there is no longer any significant rise in temperature, and which therefore, with constant outside temperature, has a temperature not more than 5° C. lower than the maximum attained in sustained operation at this constant outside temperature. Preferably, "prolonged operation" is operation of the motor vehicle for at least 15 min, more preferably operation of the motor vehicle for at least 30 min, especially operation of the motor vehicle for at least 1 h.

In a preferred embodiment of the lighting device of the invention, the emitter E is used as emission material in the emission layer B, wherein it is used either as a pure layer or in combination with one or more host materials.

The proportion by mass of the emitter E in the emission layer B, in a preferred embodiment, is between 1% and 80%. The emission layer B, in an alternative embodiment, may also consist exclusively of the emitter E, in which case the anode and the cathode may have been applied to the substrate, and the emission layer B may have been disposed between anode and cathode.

In a preferred embodiment, the emission layer B has been applied to a substrate, preferably with application of an anode and a cathode to the substrate and with application of the emission layer B between anode and cathode.

In a preferred embodiment, the inventive composition of the emission layer B comprises an emitter E and one or more host materials. More preferably, the invention relates to a composition including or consisting of:

(a) at least one inventive organic molecule, preferably as emitter and/or host, especially emitter E, and
(b) optionally at least one, i.e. one or more, emitter and/or host material(s) other than emitter E and
(c) optionally one or more dyes and/or one or more organic solvents.

In a preferred embodiment, the emission layer B therefore comprises:

(a) the emitter E;
(b) one or more host materials H other than the emitter E;
(c) one or more TADF emitters K other than the emitter E, and
(d) one or more further components selected from the list consisting of one or more emitters F that are not TADF emitters, one or more dyes C, one or more solvents L and combinations of two or more of these.

In a more strongly preferred embodiment, the emission layer B consists of:

(a) the emitter E;
(b) one or more host materials H other than the emitter E;
(c) one or more TADF emitters K other than the emitter E, and
(d) one or more further components selected from the list consisting of one or more emitters F that are not TADF emitters, one or more dyes C, one or more solvents L and combinations of two or more of these.

In other words, the lighting device of the invention is preferably characterized in that the emission layer B of a composition including (or consisting of):

(a) an emitter E
(b) a host material H and
(c) optionally a further host material D or a fluorescence emitter F or a TADF emitter K,
where E, H, D, F and K are each different.

The host material(s) preferably has/have triplet (T1) and singlet (S1) energy levels at higher energy than the triplet (T1) and singlet (S1) energy levels of the emitter E. In a preferred embodiment, the composition, as well as the emitter E, includes an electron-dominant and/or hole-dominant host material. The highest occupied orbital (HOMO) and the lowest unoccupied orbital (LUMO) of the hole-dominant host material are preferably at higher energy than those of the electron-dominant host material.

The HOMO of the hole-dominant host material is preferably at lower energy than the HOMO of the emitter E, while the LUMO of the electron-dominant host material is preferably at higher energy than the LUMO of the emitter E. In order to avoid exciplex formation between emitter and host material(s), the materials are preferably chosen such that the energy differences between the respective orbitals are small. The difference between the LUMO of the electron-dominant host material and the LUMO of the emitter E is preferably less than 0.5 eV, more preferably less than 0.3 eV, especially less than 0.2 eV. The difference between the HOMO of the hole-dominant host material and the HOMO of the emitter E is preferably less than 0.5 eV, preferably less than 0.3 eV, especially less than 0.2 eV.

In a preferred embodiment, an OLED according to the present invention has the following construction:

a substrate,
an anode,
at least one emission layer B comprising emitter E and optionally further components selected from one or more host materials H, one or more TADF emitters K and one or more further components as each described herein, and
a cathode, wherein the cathode or the anode has been applied to the substrate, and the at least one emission layer B which is disposed between anode and cathode.

In a preferred embodiment, the optoelectronic device is an OLED preferably having the following layer structure:

1. Substrate (carrier material)
2. Anode
3. Hole injection layer (HIL)
4. Hole transport layer (HTL)
5. Electron blocking layer (EBL)
6. Inventive emitting layer B (with emitter E) (EML)
7. Hole blocking layer (HBL)
8. Electron transport layer (ETL)
9. Electron injection layer (EIL)
10. Cathode.

Individual layers may be present here solely in an optional manner. It is additionally possible for two or more of these layers to coincide. And individual layers may be replicated in the component.

In a preferred embodiment, at least one electrode in the organic component is in translucent form. A "translucent" layer here is one that is transparent to visible light (and therefore in particular a wavelength range from 420 to 750 nm, preferably 400 to 800 nm). The translucent layer here may be clearly transparent or at least partly light-absorbing and/or party light-scattering, such that the translucent layer may, for example, also have diffuse or milky translucence. More particularly, a layer referred to here as translucent has maximum transparency, such that the absorption of light in particular is as low as possible.

In an alternative embodiment, the organic component, especially an OLED, has an inverted structure. It is a feature of the inverted structure that the cathode is on the substrate and the other layers are applied in a correspondingly inverted manner:

1. Substrate (carrier material)
2. Cathode
3. Electron injection layer (EIL)

4. Electron transport layer (ETL)
5. Hole blocking layer (HBL)
6. Inventive emitting layer B (comprising emitter E) (EML)
7. Electron blocking layer (EBL)
8. Hole transport layer (HTL)
9. Hole injection layer (HIL)
10. Anode It is also possible here for individual layers to be present merely in an optional manner. It is additionally possible for two or more of these layers to coincide. And individual layers may be replicated in the component.

In one embodiment of the organic optoelectronic device of the invention, a hole- and electron-injecting layer has been applied between anode and cathode, and a hole- and electron-transporting layer between hole- and electron-injecting layer, and the emission layer B between hole- and electron-transporting layer.

In a further embodiment of the invention, the organic optoelectronic device has: a substrate, an anode, a cathode and at least one hole-injecting and one electron-injecting layer, and at least one hole-transporting and one electron-transporting layer, and at least one emission layer B including emitter E and one or more host materials having triplet ($T_1$) and singlet ($S_1$) energy levels at higher energy than the triplet ($T_1$) and singlet ($S_1$) energy levels of the emitter E, where the cathode and the anode have been applied to the substrate, and the hole- and electron-injecting layer has been applied between anode and cathode, and the hole- and electron-transporting layer has been applied between hole- and electron-injecting layer, and the emission layer B has been applied between hole- and electron-transporting layer.

In a preferred embodiment, in the inverted OLED, the anode layer of the typical structure, for example an ITO layer (indium tin oxide), is connected as cathode.

In a further preferred embodiment, the lighting device of the invention has a stacked structure, wherein the individual OLEDs are stacked one on top of another and not alongside one another as usual. A stacked structure can enable the generation of mixed light. For example, this structure may be used in the generation of white light, which is generated by creating the entire visible spectrum, typically through the combination of the emitted light from blue, green and red emitters.

In addition, given virtually equal efficiency and identical luminance, significantly longer lifetimes can be achieved compared to conventional OLEDs. For the stacked structure, what is called a charge generation layer (CGL) between two OLEDs is optionally used. This may consist of an n-doped and a p-doped layer, with the n-doped layer typically applied closer to the anode.

In one embodiment—called a tandem OLED—two or more emission layers occur between anode and cathode. In one embodiment, three emission layers are arranged one on top of another, with one emission layer emitting red light, one emission layer emitting green light and one emission layer emitting blue light, and optionally further charge generation, blocker or transport layers applied between the individual emission layers. In a further embodiment, the respective emission layers are applied in a directly adjacent manner. In a further embodiment, there is a charge generation layer in each case between the emission layers. In addition, in an OLED, it is possible to combine directly adjoining emission layers separated by charge generation layers.

There may additionally also be an encapsulation disposed above the electrodes and the organic layers. The encapsulation may be executed, for example, in the form of a glass lid or in the form of a thin-film encapsulation.

The support material used in the optoelectronic device may, for example, be glass, quartz, plastic, metal, a silicon wafer or any other suitable solid or flexible, optionally transparent material. The support material may, for example, include one or more materials in the form of a layer, a film, a plate or a laminate.

Anodes used in the optoelectronic device may, for example, be transparent conductive metal oxides, for example ITO (indium tin oxide), zinc oxide, tin oxide, cadmium oxide, titanium oxide, indium oxide or aluminum zinc oxide (AZO), $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides.

Materials used in an HIL may, for example, be PEDOT:PSS (poly-3,4-ethylenedioxythiophene:polystyrenesulfonic acid), PEDOT (poly-3,4-ethylenedioxythiophene), m-MTDATA (4,4',4"-tris[phenyl(m-tolyl)amino]triphenylamine), spiro-TAD (2,2',7,7'-tetrakis(N,N-diphenylamino)-9,9-spirobifluorene), DNTPD (4,4'-bis[N-[4-{N,N-bis(3-methylphenyl)amino}phenyl]-N-phenylamino]biphenyl), NPB (N,N'-bis-(1-naphthalenyl)-N,N'-bisphenyl-(1,1'-biphenyl)-4,4'-diamine), NPNPB (N,N'-diphenyl-N,N'-di-[4-(N,N-diphenylamino)phenyl]benzene), MeO-TPD (N,N,N',N'-tetrakis(4-methoxyphenyl)benzene), HAT-CN (1,4,5,8,9,11-hexaazatriphenylene-hexacarbonitrile) or spiro-NPD (N,N'-diphenyl-N,N'-bis-(1-naphthyl)-9,9'-spirobifluorene-2,7-diamine). By way of example, the layer thickness is 10-80 nm. In addition, it is possible to use small molecules (for example copper phthalocyanine (CuPc, e.g. thickness 10 nm)) or metal oxides, for instance $MoO_3$, $V_2O_5$.

Materials used in an HTL may be tertiary amines, carbazole derivatives, polystyrenesulfonic acid-doped polyethylenedioxythiophene, camphorsulfonic acid-doped polyaniline, poly-TPD (poly(4-butylphenyldiphenylamine)), [alpha]-NPD (poly(4-butylphenyldiphenylamine)), TAPC (4,4'-cyclohexylidenebis[N,N-bis(4-methylphenyl)benzeneamine]), TCTA (tris(4-carbazoyl-9-ylphenyl)amine), 2-TNATA (4,4',4"-tris[2-naphthyl(phenylamino)]triphenylamine), spiro-TAD, DNTPD, NPB, NPNPB, MeO-TPD, HAT-CN or TrisPcz (9,9'-diphenyl-6-(9-phenyl-9H-carbazol-3-yl)-9H,9'H-3,3'-bicarbazole). By way of example, the layer thickness is 10 nm to 100 nm.

The HTL may be a p-doped layer comprising an inorganic or organic dopant in an organic hole-conducting matrix. Inorganic dopants utilized may, for example, be transition metal oxides, for instance vanadium oxide, molybdenum oxide or tungsten oxide. Organic dopants used may, for example, be tetrafluorotetracyanoquinodimethane (F4-TCNQ), copper pentafluorobenzoate (Cu(I)pFBz) or transition metal complexes. By way of example, the layer thickness may be 10 nm to 100 nm.

Materials used in an electron blocker layer may, for example, be mCP (1,3-bis(carbazol-9-yl)benzene), TCTA, 2-TNATA, mCBP (3,3-di(9H-carbazol-9-yl)-biphenyl), trisPcz (9,9'-diphenyl-6-(9-phenyl-9H-carbazol-3-yl)-9H,9'H-3,3'-bicarbazole), CzSi (9-(4-tert-butylphenyl)-3,6-bis(triphenylsilyl)-9H-carbazole) or DCB (N,N'-dicarbazolyl-1,4-dimethylbenzene). By way of example, the layer thickness may be 10 nm to 50 nm.

The emission layer B (emitter layer EML) comprises (or consists of) emitter material or a mixture comprising at least two emitter materials and optionally one or more host materials. According to the invention, the emission layer B comprises at least one emitter B that emits light by means of thermally activated delayed fluorescence (TADF). Suitable host materials are, for example, mCP, TCTA, 2-TNATA, mCBP, CBP (4,4'-bis-(N-carbazolyl)biphenyl), Sif87 (dibenzo[b,d]thiophen-2-yltriphenylsilane), Sif88 (dibenzo [b,d]thiophen-2-yl-diphenylsilane) or DPEPO (bis[2-((oxo) diphenylphosphino)phenyl]ether).

For emitter material that emits in the green or in the red or a mixture comprising at least two emitter materials, suitable matrix materials are the standard matrix materials such as CBP. For emitter material that emits in the blue or a mixture comprising at least two emitter materials, it is possible to use UHG matrix materials (ultrahigh energy gap materials) (see, for example, M. E. Thompson et al., Chem. Mater. 2004, 16, 4743) or other "wide-gap" matrix materials. By way of example, the layer thickness is 10 nm to 250 nm.

The hole blocker layer HBL may comprise, for example, BCP (2,9-dimethyl-4,7-diphenyl-1,10-phenanthroline=bathocuproin), bis-(2-methyl-8-hydroxyquinolinato)(4-phenylphenolato)aluminum(III) (BAlq), Nbphen (2,9-bis(naphthalen-2-yl)-4,7-diphenyl-1,10-phenanthroline), Alq3 (aluminum tris(8-hydroxyquinoline)), TSPO1 (diphenyl-4-triphenylsilylphenylphosphine oxide) or TCB/TCP (1,3,5-tris(N-carbazolyl)benzene/1,3,5-tris (carbazol)-9-yl)benzene). By way of example, the layer thickness may be 10 nm to 50 nm.

The electron transport layer ETL may comprise, for example, materials based on $AlQ_3$, TSPO1, BPyTP2 (2,7-di(2,2'-bipyridin-5-yl)triphenyl), Sif87, Sif88, BmPyPhB (1,3-bis[3,5-di(pyridin-3-yl)phenyl]benzene) or BTB (4,4'-bis-[2-(4,6-diphenyl-1,3,5-triazinyl)]-1,1'-biphenyl). By way of example, the layer thickness may be 10 nm to 200 nm.

Materials used in a thin electron injection layer EIL may, for example, be CsF, LiF, 8-hydroxyquinolinolatolithium (Liq), $Li_2O$, $BaF_2$, MgO or NaF.

Materials used in the cathode layer may be metals or alloys, for example Al, Al>AlF, Ag, Pt, Au, Mg, Ag:Mg. Typical layer thicknesses are 100 nm to 200 nm. In particular, one or more metals that are stable to air and/or self-passivating, for example through formation of a thin protective oxide layer, are used.

Suitable materials for encapsulation are, for example, aluminum oxide, vanadium oxide, zinc oxide, zirconium oxide, titanium oxide, hafnium oxide, lanthanum oxide, tantalum oxide and mixtures of two or more of these.

In one embodiment of the invention, the lighting device of the invention has an external quantum efficiency (EQE) at 1000 cd/$m^2$ of greater than 5%, especially of greater than 8%, especially of greater than 10%, or of greater than 13%, or of greater than 16% and especially of greater than 20% and/or an LT80 value (lifetime by which the luminance has dropped to 80% of the original luminance at constant current density, measured for instance at 70° C.) at 500 cd/$m^2$ of greater than 30 h, especially of greater than 70 h, or of greater than 100 h, or of greater than 150 h and especially of greater than 200 h.

In one embodiment of the invention, the lighting device of the invention has an external quantum efficiency (EQE) at 1000 cd/$m^2$ of greater than 5%, especially of greater than 8%, especially of greater than 10%, or of greater than 13%, or of greater than 16% and especially of greater than 20% and/or an LT80 value (lifetime by which the luminance has dropped to 80% of the original luminance at constant current density, measured for instance at 20° C.) at 500 cd/$m^2$ of greater than 30 h, especially of greater than 70 h, or of greater than 100 h, or of greater than 150 h and especially of greater than 200 h.

The motor vehicle comprising a lighting device of the invention also differs from prior art motor vehicles in that the lighting, at elevated temperature, shows improved optical properties and a longer lifetime than the known OLED lighting devices. Therefore, a further aspect of the present invention relates to a motor vehicle comprising at least one lighting device of the invention.

The properties defined in connection with lighting devices are preferred embodiments that can be defined in the same way for the motor vehicle. In addition, the lighting device of the invention permits the effective generation of light at elevated operating temperatures.

Therefore, a further aspect of the present invention relates to a method of generating light by means of an organic light-emitting diode (OLED) at an operating temperature thereof in the range from 30° C. to 160° C., comprising the steps of:

(i) providing the OLED of the invention having properties as defined herein; and (ii) applying an electrical voltage to the OLED from step (i).

In other words, the present invention also relates to a method of generating light by means of a lighting device for a motor vehicle according to the present invention at an operating temperature thereof in the range from 30° C. to 160° C., comprising the steps of:

(i) providing the lighting device for a motor vehicle according to the present invention; and (ii) applying an electrical voltage to the lighting device from step (i).

It will be recognized that the properties and preferred embodiments defined in connection with the lighting device can be defined in the same way for the method of the invention for generating light by means of such a lighting device.

In a preferred embodiment, the method of the invention generates light within the wavelength range from 420 to 600 nm.

In a preferred embodiment, the lighting device or OLED used in the performance of the method is part of a lighting device for a motor vehicle according to the present invention.

The examples that follow and FIG. 1 serve to further elucidate the invention.

BRIEF DESCRIPTION OF THE FIGURE

FIG. 1 shows the two measurement points at room temperature and at 70° C., with the lifetime reported relative to the lifetime at room temperature corresponding to the normalized value of 1.0, for the system of the invention (filled rectangle: inventive example 1, unfilled triangle: comparative example).

EXAMPLE

Example 1

An OLED pixel was produced with the following construction (proportion of the emitter and of the host molecule in the emission layer reported in percent by mass in each case):

| Layer | Thickness | Material |
|---|---|---|
| 8 | 100 nm | Al |
| 7 | 2 nm | Liq |
| 6 | 40 nm | NBPhen |
| 5 | 20 nm | 9-[3,5-bis(2-dibenzofuranyl)phenyl]-9H-carbazole:T2T:E1 (70:20:10) |
| 4 | 8 nm | 9-[3,5-bis(2-dibenzofuranyl)phenyl]-9H-carbazole |
| 3 | 10 nm | TCTA |
| 2 | 75 nm | NPB |
| 1 | 130 nm | ITO |
| Substrate | | Glass |

E1

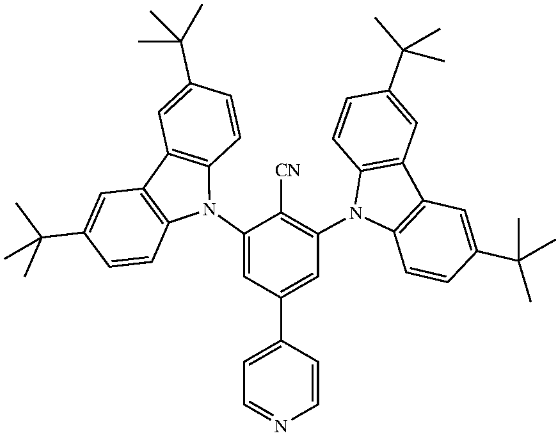

The LT80 values for OLED pixels were measured at room temperature and for 70° C. For the lifetimes at 70° C., the pixels were placed into an oven and taken out every 1 to 2 hours, and a Minolta luminance camera was used to measure the luminance. The LT80 values at 500 cd/m$^2$ were determined by the following equation:

$$LT80\left(500\frac{cd^2}{m^2}\right) = LT80(L_0)\left(\frac{500\frac{cd^2}{m^2}}{L_0}\right)^{-1.6}$$

where $L_0$ corresponds to the starting luminance at the current density used.

As shown in FIG. 1, the values for a comparative OLED known from the literature including phosphorescent emitters in the emission layer are likewise included, which have been taken from the publication by Pang et al. (Thermal behavior and indirect life test of large-area OLED lighting panels, Journal of Solid State Lighting, 2014, 1:7; DOI: 10.1186/2196-1107-1-7). The lifetime of the inventive OLEDs is shortened at 70° C. to 35% of the room temperature lifetime; the comparative example shows a much more significant shortening of the lifetime to 11%.

The invention claimed is:

1. A motor vehicle comprising at least one lighting device, wherein the lighting device comprises at least one organic light-emitting diode (OLED) having an emission layer B, wherein the emission layer B comprises at least one emitter E that emits light by thermally activated delayed fluorescence (TADF) and at least one host material;

wherein the emission layer B consists of exclusively materials having a glass transition temperature exceeding 120° C., and wherein triplet (T1) energy level of the host material is higher than triplet (T1) energy level of the emitter E, and singlet (S1) energy level of the host material is higher than singlet (S1) energy level of the emitter E.

2. The motor vehicle of claim 1, wherein the emitter E has an energy differential ΔE between the lowest excited singlet state S1 and the triplet state T1 beneath of not more than 0.3 eV.

3. The motor vehicle of claim 1, wherein the OLED has an emission maximum in the range from 420 nm to 800 nm.

4. The motor vehicle of claim 1, wherein the external quantum efficiency (EQE) of the OLED rises with rising temperature.

5. The motor vehicle of claim 1, wherein the emitter E has a molecular mass of more than 1000 g/mol.

6. The motor vehicle of claim 1, wherein the emitter E is a purely organic TADF emitter.

7. The motor vehicle of claim 1, wherein the emitter E has a glass transition temperature exceeding 130° C.

8. The motor vehicle of claim 1, wherein the lighting device is a thermally stable lighting device and the OLED comprises exclusively materials having a glass transition temperature exceeding 120° C.

9. The motor vehicle of claim 1, wherein the emission layer B consists of:

(a) the emitter E;

(b) one or more host materials H other than the emitter E;

(c) one or more TADF emitters K other than the emitter E; and (d) one or more further components selected from the group consisting of one or more emitters F that are not a TADF emitter, one or more dyes C, one or more solvents L, and combinations of two or more of these.

10. A method of generating light by an organic light-emitting diode (OLED) at an operating temperature thereof in the range from 30° C. to 160° C., comprising the steps of:

(i) providing the OLED which is part of a lighting device for the motor vehicle of claim 1; and (ii) applying an electrical voltage to the OLED from step (i).

11. The method of claim 10, wherein light in the wavelength range from 420 to 800 nm is generated.

12. The lighting device of claim 1, wherein the lighting device is a signal light on the exterior of the motor vehicle that may be selected from the group consisting of an alternately illuminated direction indicator, a taillight, a brakelight, an elevated brakelight, and an exterior display.

13. The lighting device of claim 1, wherein the lighting device is arranged on or in the motor vehicle such that, in prolonged operation of the motor vehicle at an outside temperature of 20° C., it is subject to an operating temperature elevated by at least 10° C. compared to the outside temperature.

* * * * *